(12) United States Patent
Kasama et al.

(10) Patent No.: US 7,675,230 B2
(45) Date of Patent: Mar. 9, 2010

(54) LIGHT-EMITTING ELEMENT AND DEVICE

(75) Inventors: Yasuhiko Kasama, Sendai (JP); Kenji Omote, Sendai (JP)

(73) Assignee: Ideal Star Inc., Sendai-Shi (JP)

( * ) Notice: Subject to any disclaimer, the term of this patent is extended or adjusted under 35 U.S.C. 154(b) by 582 days.

(21) Appl. No.: 10/563,555

(22) PCT Filed: Jul. 12, 2004

(86) PCT No.: PCT/JP2004/009924

§ 371 (c)(1),
(2), (4) Date: May 19, 2006

(87) PCT Pub. No.: WO2005/020641

PCT Pub. Date: Mar. 3, 2005

(65) Prior Publication Data
US 2006/0250075 A1    Nov. 9, 2006

(30) Foreign Application Priority Data

Jul. 10, 2003  (JP) .............................. 2003-273101
Sep. 12, 2003  (JP) .............................. 2003-321026

(51) Int. Cl.
*H01J 1/62* (2006.01)
*H01J 63/04* (2006.01)
(52) U.S. Cl. .................. 313/506; 313/498; 313/511
(58) Field of Classification Search ......... 313/504–507, 313/509, 511; 428/690, 917; 250/462.1, 250/463.1, 464.1, 465.1, 483.1; 362/552, 362/84, 257, 260, 800, 554–556, 559, 561, 362/565, 571
See application file for complete search history.

(56) References Cited

U.S. PATENT DOCUMENTS 6,437,422 B1 *   8/2002   Solomon et al. ............ 257/618

(Continued)

FOREIGN PATENT DOCUMENTS

JP          36-22511         11/1961

(Continued)

OTHER PUBLICATIONS

Included machine translation of JP 2000-182770 to Masataka and JP 2004-258206.*

(Continued)

*Primary Examiner*—Toan Ton
*Assistant Examiner*—Zachary Snyder
(74) *Attorney, Agent, or Firm*—Young & Thompson

(57) ABSTRACT

A light-emitting element used for display devices and illuminating devices has been formed on a flat substrate, and therefore, when the size of such devices is increased, manufacturing apparatuses also have to be enlarged. Also, a problem involved has been that even a failure of one light-emitting element causes the entire device to fail, making improvement of production yield difficult. To solve the above problems, in the present invention, light-emitting elements are formed as linear elements, and the linear elements are combined to form a plane light-emitting device. This enables the light-emitting device to be produced by selecting only linear light-emitting elements of good quality, and enlargement of apparatuses and enhancement of production yield can be expected.

12 Claims, 15 Drawing Sheets

U.S. PATENT DOCUMENTS

| | | | |
|---|---|---|---|
| 2001/0026125 A1* | 10/2001 | Yamazaki et al. | 313/505 |
| 2002/0025419 A1* | 2/2002 | Lee et al. | 428/212 |
| 2003/0170491 A1* | 9/2003 | Liao et al. | 428/690 |
| 2004/0214041 A1* | 10/2004 | Lu et al. | 428/690 |
| 2005/0218461 A1* | 10/2005 | Kasama et al. | 257/401 |

FOREIGN PATENT DOCUMENTS

| | | |
|---|---|---|
| JP | 50-21836 | 7/1975 |
| JP | 09-309711 | 12/1997 |
| JP | 2000-182770 | 6/2000 |
| JP | 2001-189466 | 7/2001 |
| JP | 2001-319773 | 11/2001 |
| JP | 2002-184580 | 6/2002 |
| JP | 2003-59657 | 2/2003 |
| JP | 2003-282256 | 10/2003 |
| JP | 2004-258206 | 9/2004 |
| JP | 2004-311221 | 11/2004 |

OTHER PUBLICATIONS

"Yuki EL Display ni Okeru Zairyo Gijutsu to Soshi no Sakusei", $1^{st}$ edition, Kabushiki Kaisha Gijutsu Joho Kyokai Hakko, Jan. 31, 2002, p. 226; Fig. 4.

* cited by examiner (a)

(b)

(c)

(a)

(b)

(a)

(b)

(a)

(b)

(a)

(b)

LIGHT-EMITTING ELEMENT AND DEVICE

FIELD OF THE INVENTION

The present invention relates to a light-emitting element and device used in a display device and an illuminating device.

BACKGROUND ART

Various display devices characterized by its thin and flat structure such as a liquid-crystal display and a plasma display are prevailing widely as a display device in place of a cathode-ray tube. Also, a display using an organic EL expected to be a main stream of the next-generation display is being studied. Since the organic EL converts electricity into light using electroluminescence, it hardly generates heat and uses less power. Also, it has a characteristic that a sharp image can be displayed regardless of the viewing angle, unlike the liquid-crystal display.

FIGS. 9(a) and (b) are a sectional view and a corresponding circuit diagram of a light-emitting element comprising a light-emitting region using a conventional organic EL and SIT for driving when formed on a rigid substrate. On a glass substrate 100, a source region 101, a channel region 102, a light-emitting region 104 and a drain region 105 are sequentially laminated and formed. As the source region 101, a transparent electrode material such as ITO is used. As a material for the light-emitting region 104, an inorganic material such as ZnS and SrS, a low molecular organic EL such as Alq$_3$ and NPB or a high molecular organic EL such as PPV and poly (3-alkylthiophene) is used. The SIT for driving is comprised by the source region 101, a semiconductor region 102 made of a P-type conductive polymer, a gate electrode 103 made of an N-type conductive polymer formed in the comb-tooth state and the drain region 105 in parallel with the source region 101 and the light-emitting region 104 within the semiconductor region 102. For example, the source region 101 is set to grounding potential, a negative bias voltage is applied to the drain region 105 and a positive control voltage is applied to the gate electrode 103. A positive hole injected from the source region 101 is re-bonded with an electron injected from the drain region 105 within the light-emitting region 104 to cause the light-emitting region 104 to emit light. The light-emitting intensity is controlled by the control voltage applied to the gate electrode 103.

FIG. 10 shows a sectional view of the light-emitting element comprised by the light-emitting region using a conventional organic EL and SIT for driving when formed on a flexible substrate. A source region 107, a semiconductor region 108, a light-emitting region 110 and a drain region 111 are sequentially laminated and formed on a plastic substrate 106. Also, a gate electrode 109 is formed in the comb-tooth state within the semiconductor region 108. In the conventional light-emitting element shown in FIG. 10, as with the conventional light-emitting element shown in FIG. 9, when the positive hole injected from the source region 107 and the electron injected from the drain region 111 are re-bonded within the light-emitting region 110, the light-emitting region 110 emits light. The light-emitting intensity of the light-emitting layer 110 is controlled by control voltage applied to the gate electrode 109.

As a method for driving control to display an image or to control illumination by arranging the light-emitting elements in the array state, a passive matrix method with a driving circuit provided outside and an active matrix method in which each of the light-emitting elements has a driving element are known. The active matrix method has the structure of the light-emitting element more complicated than the passive matrix method but is characterized by ability to be driven with a lower voltage, the life of light-emitting element is longer with lower power consumption and an external driving circuit is not needed.

FIG. 20 is a sectional view of an organic EL light-emitting element with a conventional SIT as its driving element. The conventional light-emitting element shown in FIG. 20 is comprised by a drain electrode 1202, a semiconductor layer 1204, a gate electrode 1203, a light-emitting layer 1205 and a source electrode 1206 sequentially laminated and formed on a glass substrate 1201. When a negative bias voltage is applied to the drain electrode 1202, an electron is injected from the source electrode 1206, an electron is injected from the source electrode 1206, a positive hole is injected from the drain electrode 1202, the injected electron and positive hole are re-bonded in the light-emitting layer 1205 and the light-emitting layer 1205 emits light. The light-emitting intensity is controlled by controlling the injecting amount of the positive hole through positive control voltage applied to the gate electrode 1203.

FIG. 21 is a sectional view of an organic EL light-emitting element having a control part in the conventional MOS structure. A cathode 1219 is arranged above a light-emitting layer 1220 with an anode 1218 under it, and gate electrodes 1214, 1215 are arranged on sides through gate insulating films 1216, 1217. When a negative bias voltage is applied to a cathode 219 and an anode 218, a positive hole is injected from the anode 218, an electron is injected from the cathode 1219, the injected electron and positive hole are bonded together again in the light-emitting layer 1220, and the light-emitting layer 1220 emits light. When a negative control voltage is applied to the gate electrode 1214 and a positive control voltage to the gate electrode 1215, a part of the electrons injected into the light-emitting layer 1220 are captured by the gate insulating film 1217, and a part of the injected positive holes are captured by the gate insulating film 1216 so that the number of the positive holes and electrons re-bonded in the light-emitting layer 1220 is reduced and the light-emitting intensity can be controlled.

In the conventional light-emitting element with SIT as the driving element shown in FIG. 20, the comb-tooth state gate electrode 1203 is formed by printing or deposition of a conductive organic film, and an interval L3 of the gate electrode 1203 can not be fully reduced. And since the controllability of the injected positive holes is low, it was necessary to apply a relatively high voltage to drive the light-emitting element.

On the other hand, with the conventional light-emitting element having a control part in the MOS structure shown in FIG. 21, the channel length, which is the interval between the cathode 1219 and the anode 1218 depends on the film thickness T2 of the light-emitting layer, and the channel length can be made not more than 1 μm and the light-emitting element can be made to emit light with a low voltage without using a fine process and with. However, it is necessary to form an insulating film on the side wall of the light-emitting layer and apply positive and negative control voltages to the gate electrodes formed on both the side faces, which led to a problem that manufacturing processes and control method are made complicated.

DISCLOSURE OF THE INVENTION

Problems to be Solved by the Invention

The conventional light-emitting elements are formed on a rigid flat-plane state substrate such as a glass substrate or a flexible but flat-plane state substrate such as a plastic substrate. When using a rigid substrate, there is a problem that the shape is not flexible and applications are limited since the substrate is heavy. Even if a flexible substrate such as a plastic one is used for formation, since a plurality of light-emitting elements are continuously formed on a plane, if at least any one of the light-emitting elements becomes defective, replacement of only the defective portion is not possible but the entire applied device becomes defective. Therefore, it is necessary to conduct an extremely strict process control including improvement of cleanness of the process, which is accompanied by a problem that difficulty in improvement of yield is accelerated as the size of light-emitting device to be produced is increased.

The present invention has an object to realize a light-emitting element having an organic thin-film transistor for driving with the channel length of not more than 0.5 μm in a simple process without using fine processing and to enable low-voltage driving of the light-emitting element.

Means for Solving the Problems

The light-emitting element according to the present invention is characterized by a linear light-emitting element in which a light-emitting region and a light-emitting control region are continuously or intermittently formed in the longitudinal direction.

Also, in the structure of a light-emitting element in which a gate electrode layer and a gate insulating layer are sequentially laminated on a substrate, a first electrode is arranged on the gate insulating layer, a light-emitting film is arranged on the gate insulating layer and the first electrode and a second electrode is arranged on the light-emitting film, the second electrode is arranged diagonally above the first electrode or arranged while being separated in the lateral direction with respect to the first electrode.

Effect of the Invention

1. A flexible linear light-emitting element is formed by combining a light-emitting region and a light-emitting control region. The formed linear light-emitting element is woven or knitted in the cloth state to enable fabrication of a plane-state light-emitting device. Therefore, the effects described in the following 1) to 6) can be obtained.
1) Since the light-emitting region and the light-emitting control region can be incorporated in a single linear body, there are such effects that external driving circuit is not required any more, and driving with a lower voltage becomes possible.
2) Since the plane-state light-emitting device fabricated by weaving or knitting the linear light-emitting element is flexible and light, it can be used in a wide variety of applications including thin-type TV sets, screen of personal computers, display on a cell phone, electronic paper, etc. It has a characteristic that no shade is generated even if it is used as lighting of a wall portion of the complicated shape.
3) Since a plane-state light-emitting device can be fabricated by combining linear light-emitting elements, a large-sized display or illuminating device not relying on the scale of manufacturing equipment can be produced. Illumination for a dome-type building or display can be produced, for example.
4) A plane-state display device or illuminating device can be produced by inspecting linear light-emitting elements and using only selected non-defective products. Or, since inspection can be conducted and defective linear light-emitting elements can be replaced after a plane-state light-emitting device has been produced, yield of the light-emitting device can be improved even without strict process control when the size of the light-emitting device is increased. This effect is particularly advantageous in the case of a light-emitting device of the active matrix type provided with a light-emitting control region in each light-emitting region.
5) Full-color display can be realized with a single linear light-emitting element by arranging light-emitting layers in red, green and blue or light transmitting filters in red, green and blue in a single linear light-emitting element and by independently controlling the control elements corresponding to the respective light-emitting layers or filters. Therefore, color display with high resolution is made possible.
6) By using alkali-metal including fullerene or an organic material doped with alkali-metal including fullerene as an electron injection layer or electron transport layer of a linear light-emitting element, process control of a process for manufacturing light-emitting elements is facilitated. Also, since a sealing structure in the simplified form can be used to seal the light-emitting element or light-emitting device, it is particularly advantageous in manufacture of a linear light-emitting element. Also, there is an effect that the life of the light-emitting element can be prolonged.
2. A light-emitting element having an organic EL film as a light-emitting film and an element for driving can be made in a simple process at a normal temperature and a normal pressure such as printing or deposition technique.
3. The channel length of an organic thin-film transistor can be made not more than 0.5 μm without using fine processing technology, and improvement of light-emitting efficiency and driving with a low voltage can be made possible.
4. A light-emitting device in the active matrix method with low power consumption and a longer life of light-emitting element can be produced in a process with reduced costs.

Figure 1:
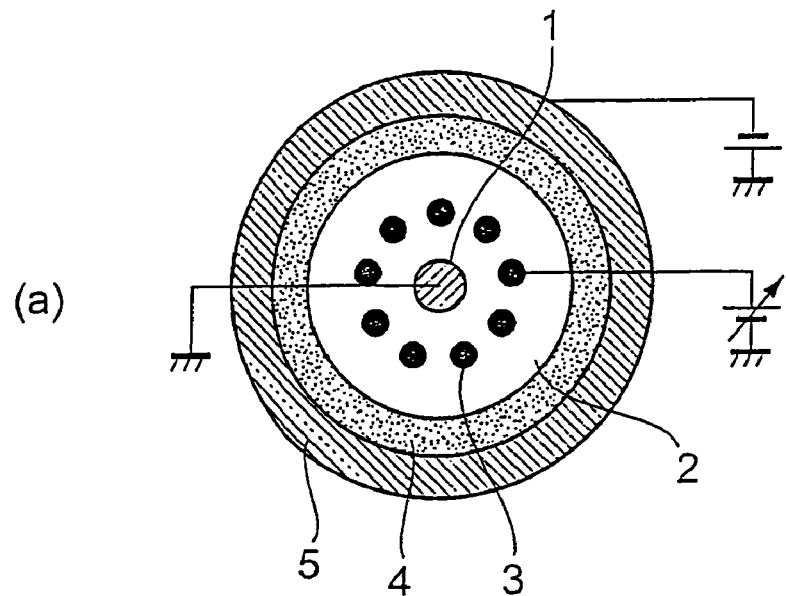
FIGS. 1(a), (b) and (c) are a sectional view, a circuit diagram and a perspective view, respectively, of a linear light-emitting element according to a first preferred embodiment of the present invention.
Figure 1:
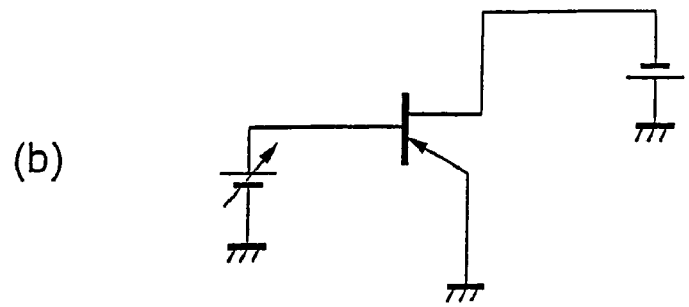
Figure 1:
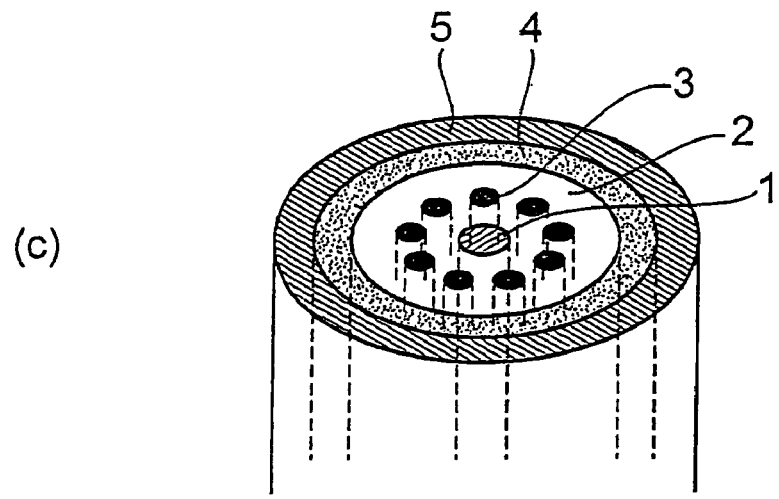

DESCRIPTION OF REFERENCE NUMERALS 1, 10, 11, 16, 25, 39, 49: Source region
2, 7, 12, 17, 26, 40, 53: Semiconductor region
3, 8, 13: Gate electrode
4, 9, 14, 54: Light-emitting region
5, 6, 15, 24, 48, 55: Drain region
18, 27, 41, 50: First gate electrode
19, 28, 42, 51: Second gate electrode
20, 29, 43, 52: Third gate electrode
21, 30, 45: Red light-emitting region
22, 31, 46: Green light-emitting region
23, 32, 47: Blue light-emitting region
33: First drain region
34: Second drain region
35: Third drain region
36, 37, 38: Insulating region
44: Reflection region
56: Red light transmitting filter
57: Green light transmitting filter
58: Blue light transmitting filter
59: Linear intermediate body
62: Linear secondary intermediate body
60: Separation region
61: Element region
63: Ion irradiation
64: Heating part
65: Gate electrode
66: Gate insulating film
67: Anode
68: Light-emitting region
69: Cathode
100: Glass substrate
106: Plastic substrate
101, 107: Source region
102, 108: Semiconductor region
103, 109: Gate electrode
104, 110: Light-emitting region
105, 111: Drain region
120: Extruding device
121: Material 1 container
122: Material 2 container
123: Material 3 container
124: Die
125: Roller
126: Linear body
1001, 1015, 1026, 1101, 1301, 1311: Glass substrate
1002, 1009, 1016, 1027, 1102, 1302, 1312: Gate electrode
1003, 1010, 1017, 1028, 1103, 1303, 1313: Gate insulating film
1004, 1011, 1020, 1029, 1106, 1305, 1315: Light-emitting layer
1005, 1012, 1023, 1032: Protective insulating layer
1006, 1113, 1024, 1030, 1104, 1308, 1317: Anode
1007, 1014, 1025, 1031, 1105, 1307, 1318: Cathode
1008: Plastic substrate
1018: Hole injection layer
1019, 1306, 1314: Hole transport layer
1021, 1304, 1316: Electron transport layer
1022: Electron injection layer
1105, 1106: Mask
1201: Glass substrate
1202: Drain electrode
1203: Gate electrode
1204: Semiconductor layer
1205: Light-emitting layer
1206: Source electrode
1211: Glass substrate
1212, 1213: separation region
1214, 1215: Gate electrode
1216, 1217: Gate insulating film
1218: Anode
1219: Cathode
1220: Light-emitting layer

BEST MODE FOR CARRYING OUT THE INVENTION (Formation of Light-emitting Element)

In the present invention, the light-emitting elements are formed in the longitudinal direction continuously or intermittently. That is, a plurality of regions are provided in the perpendicular section in the longitudinal direction, and the plurality of regions are arranged to form a single light-emitting element and the sections continue in the linear state in the longitudinal direction continuously or intermittently.

As the arranging method, there can be such a method that each of the regions is formed concentrically and arranged sequentially from the center, for example. That is, a source region, a semiconductor region including a channel region, a gate electrode, a light-emitting region and a drain region may be formed sequentially from the center. Of course other arrangements can be made, and topologically same arrangements may be used as appropriate.

Electrodes to be connected to each of the regions may be connected to them from the end face of the linear element. Or, they may be embedded in each of the regions for the first place. That is, when each of the semiconductor regions is arranged concentrically as above, the source electrode may be formed at the center of the source region and the drain electrode on the outer circumference of the drain region continuously in the longitudinal direction as with each of the semiconductor regions.

(Continuous Formation, Intermittent Formation)

When the light-emitting elements are formed continuously, any cross section takes the same shape.

The same light-emitting element may be formed in the linear form continuously in the longitudinal direction or intermittently.

(Linear)

The outer diameter of the linear light-emitting element in the present invention is preferably not more than 10 mm and more preferably not more than 5 mm. It is preferable to be not more than 1 mm and more preferable to be not more than 10 µm. It is possible to make it not more than 1 µm or further not more than 0.1 µm by using drawing processing. The smaller outer diameter is the better since the linear light-emitting element is woven to be formed into the cloth state.

When the fine linear body having the outer diameter of not more than 1 µm is discharged through a hole of a die for formation, the hole might be clogged or the linear body might be broken. In that case, the linear body of each region shall be formed for the first. Then, many islands are formed using this linear body as an island, their peripheries (sea) are surrounded by soluble substance, they are bundled by a funnel-state nozzle and a single linear body may be discharged through a small slot. When the island components are increased and the sea components are reduced, an extremely fine linear element can be made.

Another method is such that a somewhat bold linear body element is made first, and it may be drawn in the longitudinal direction afterwards. Or, a molten material may be melt-blown with a jet stream to make it finer.

Also, the aspect ratio may be an arbitrary value by extrusion forming. In case of spinning, the ratio of not less than 1000 is preferable as linear. It may be 100000 or more, for example. In the case of use after cutting, it may be a small unit of linear elements with the ratio of 10 to 10000, not more than 10 or not more than 1 or not more than 0.1.

(Intermittent Formation)

When the same elements are to be formed intermittently, elements adjacent in the longitudinal direction may be different from each other. For example, formation may be made sequentially as light-emitting element (1), inter-element separation layer (1), light-emitting element (2), inter-element separation layer (2) . . . light-emitting element (n), inter-element separation layer (n) in the longitudinal direction.

In this case, the length of the light-emitting element (k) (k=1~n) and that of the other light-emitting elements may be the same or different. That can be selected as appropriate according to the characteristics of the desired circuit element. It also applies to the length of an inter-element separation layer.

Of course, another layer may be interposed between the light-emitting element and the inter-element separation layer.

(Sectional Shape)

The sectional shape of a linear element is not particularly limited. It may be circular, polygonal, star-shaped or any other shape, for example. It may be a polygonal shape with a plurality of acute vertical angles, for example.

Also, the section of each region may be arbitrary. That is, in the case of a structure shown in FIG. 1, for example, the source region may be in the star-shaped and the outer shape of the linear light-emitting element may be circular. Depending on the element, if a contact area with the adjacent layer is to be made larger, the polygonal shape with acute vertical angles is preferable.

A desired sectional shape can be realized easily only by making the shape of an extrusion die in the desired shape.

If the section of the outermost layer is a star shape or a shape with acute apex angles, another arbitrary material may be embedded in a space between the vertical angles after extrusion by dipping, for example, and the characteristics of the element can be varied according to the application of the element.

If impurities are to be doped into the semiconductor layer, the impurities may be contained in the molten material, or the linear body is made to pass through a vacuum chamber as it is after extrusion, and the impurities may be doped by ion implantation, for example, in the vacuum chamber. If the semiconductor layer is formed inside, not on the outermost layer, ion may be implanted only in the semiconductor layer which is an inner layer by controlling ion irradiation energy.

Manufacture Example, Post-processing Formation

The above manufacture example is an example of integral formation of an element having a plurality of layers by extrusion, but the element may be formed by forming a base portion of the element in the linear shape by extrusion and then, by coating the base portion in an appropriate method.

(Raw Material)

It is preferable to use conductive polymers as a material for electrodes and semiconductor layers. They can be polyacetylene, polyacene (oligoacene), polythiazyl, polythiophene, poly (3-alkilthiophene), oligothiophene, polypyrrole, polyaniline, polyphenylene, etc., for example. Any of them may be chosen as an electrode or a semiconductor layer considering conductivity or the like.

As a material for semiconductor, polyparaphenylene, polythiophene, poly (3-methylthiophene), etc., for example, are used preferably.

As a material for source and drain, the above semiconductor material mixed with dopant may be used. To have n-type, alkali metal (Na, K, Ca), for example, may be mixed. $AsF_5/AsF_3$ or $ClO_4^-$ may be used as a dopant in some cases.

The light-emitting region may be formed as (1) single-layer film made of a light-emitting layer; (2) 2-layer film in which a light-emitting layer and an electron transport layer are laminated; (3) 3-layer film in which a positive-hole transport layer, a light-emitting layer and an electron transport layer are sequentially laminated; (4) 4-layer film in which a positive-hole injection layer, a positive-hole transport layer, a light-emitting layer and an electron injection layer are sequentially laminated, or (5) 5-layer film in which a positive-hole injection layer, a positive-hole transport layer, a light-emitting layer, an electron transport layer and an electron injection layer are sequentially laminated. In the case of a multilayered film, lamination is made sequentially in the radial direction. The order of lamination is such that, in the case of the 5-layer film, for example, a positive-hole injection layer, a positive-hole transport layer, a light-emitting layer, an electron transport layer and an electron injection layer are laminated sequentially from the center toward the outer circumference when a positive bias voltage is applied to the center of the linear body as compared with the outer circumference side. When a negative bias voltage is applied to the center of the linear body as compared with the outer circumference side, the lamination is made sequentially in the order of an electron injection layer, an electron transport layer, a light-emitting layer, a positive-hole transport layer and a positive-hole injection layer from the center toward the outer circumference. For the multilayered films other than the 5-layer film, that is, for the 3-layer film and 4-layer film, lamination is made as with the 5-layer film.

As a material for the light-emitting layer, a low molecular organic EL material such as $Alq_3$ and NPB or a high molecular organic material such as PPV and poly (3-alkilthiophene), for example, is used. As a material for a positive-hole injection layer, polythiophene such as copper phthalocyanine and PEDOT or an organic material such as polyaniline, for example, is used. As a material for the positive-hole transport layer, an organic material such as TPD and TPAC, for example, is used. As a material for the electron transport layer, fullerene including alkali metal such as Na, K, an organic material doped with alkali-metal including fullerene or an organic material such as BND, PBD, p-EtTAZ and BCP, for example, is used. As a material to dope alkali-metal including fullerene, polyparaphenylene, polythiophene, poly (3-methylthiophene) or the like, for example, is used. As an electron injection layer, fullerene including alkali metal such as Na, K or an organic material doped with alkali-metal including fullerene or an inorganic material such as LiF and Mg, for example, is used.

When an organic material doped with alkali metal is used for the electron injection layer or the electron transport layer, a radical anion of an organic molecule is generated, which behaves as an internal carrier when an electric field is applied, driving voltage of the organic EL can be reduced. However, alkali metal has a problem that alkali it has high reactivity and is likely to be formed into a hydroxide, which makes process control difficult. On the other hand, when an alkali-metal including fullerene with which driving voltage can be reduced as with the organic material doped with alkali metal or an organic material doped with alkali-metal including fullerene is used, the alkali-metal including fullerene is a molecule in the structure that alkali metal is confined in the fullerene, which is a spherical carbon cluster, and its reactivity with moisture in the atmosphere or other impurities is lower than the organic material doped with alkali metal. Therefore, it has such effects that the process control is facilitated, a simplified sealing structure can be used for sealing the light-emitting element or the light-emitting device and that the life of the light-emitting element can be prolonged.

As an insulating material, a generally used resin material may be used. Or other inorganic materials such as SiO2 may be also used.

In the case of a linear element in the structure having a semiconductor region or a conductive region at the center, the center region may be constituted by an amorphous material (metal material such as aluminum and copper; semiconductor material such as silicon). A linear amorphous material is made to penetrate the center of a die to have the linear amorphous material run, and its outer circumference may be coated with other desired regions by injection. When a conductive region made of a high molecular organic material is used as the center region of a linear body, it is preferable to mix fullerene or including fullerene in the conductive region. As fullerene, Cn (n=60 to 80) is preferable. As an included atom of including fullerene, Na, Li, H, N or F is preferable.

EXAMPLE

First Preferred Embodiment

FIG. 1(a) is a sectional view of a linear light-emitting element according to a first preferred embodiment of the present invention, and FIG. 1(e) is a perspective view of the linear light-emitting element according to the first preferred embodiment of the present invention. It is formed by sequentially laminating a semiconductor region 2 made of a P-type high molecular material around a source region 1 made of a conductive high molecular material, a light-emitting region 4 and a drain region 5. Within the semiconductor region 2, a plurality of gate electrodes 3 made of an N-type high molecular material is arranged surrounding the source region 1. The light-emitting control region made of the source region 1, the semiconductor region 2, the gate electrodes 3 and the drain region 5 surrounds the light-emitting region 4 in the section of the linear body and controls light-emitting intensity of the light-emitting region 4.

Even if the source region 1 further has a hollow region at the center or an insulating region, a semiconductor region or a conductor region made of a material different from the material constituting the source region is provided, it is obvious that the linear element of the present invention shown in FIG. 1 functions as a light-emitting element and the effect of the present invention can be obtained.

FIG. 1(b) is a circuit diagram of the linear light-emitting element according to the first preferred embodiment of the present invention. The source region 1 is connected to grounding potential, for example, and a negative bias voltage is applied to the drain region 5. To the gate electrodes 3, a positive control voltage is applied. A positive hole is injected from the source region 1, an electron is injected from the drain region 5, and the injected positive hole and electron are re-bonded in the light-emitting region 4, which causes the light-emitting region 4 to emit light. The intensity of emitted light is controlled by controlling the injection amount of the positive hole by the positive control voltage applied to the gate electrodes 3.

In the first preferred embodiment of the present invention, explanation was made such that the semiconductor region 2 is made of a P-type high molecular material and the gate electrode 3 is made of an N-type high molecular material, but even if he semiconductor region 2 is made of an N-type high molecular material and the gate electrode 3 is made of a P-type high molecular material, when the polarities of voltage to be applied to the source region, the drain region and the gate electrodes are selected appropriately, it is obvious that the embodiment operates as a light-emitting element and the effect of the present invention is similarly obtained.

(Manufacturing Device, Manufacturing Method)

Figure 11:
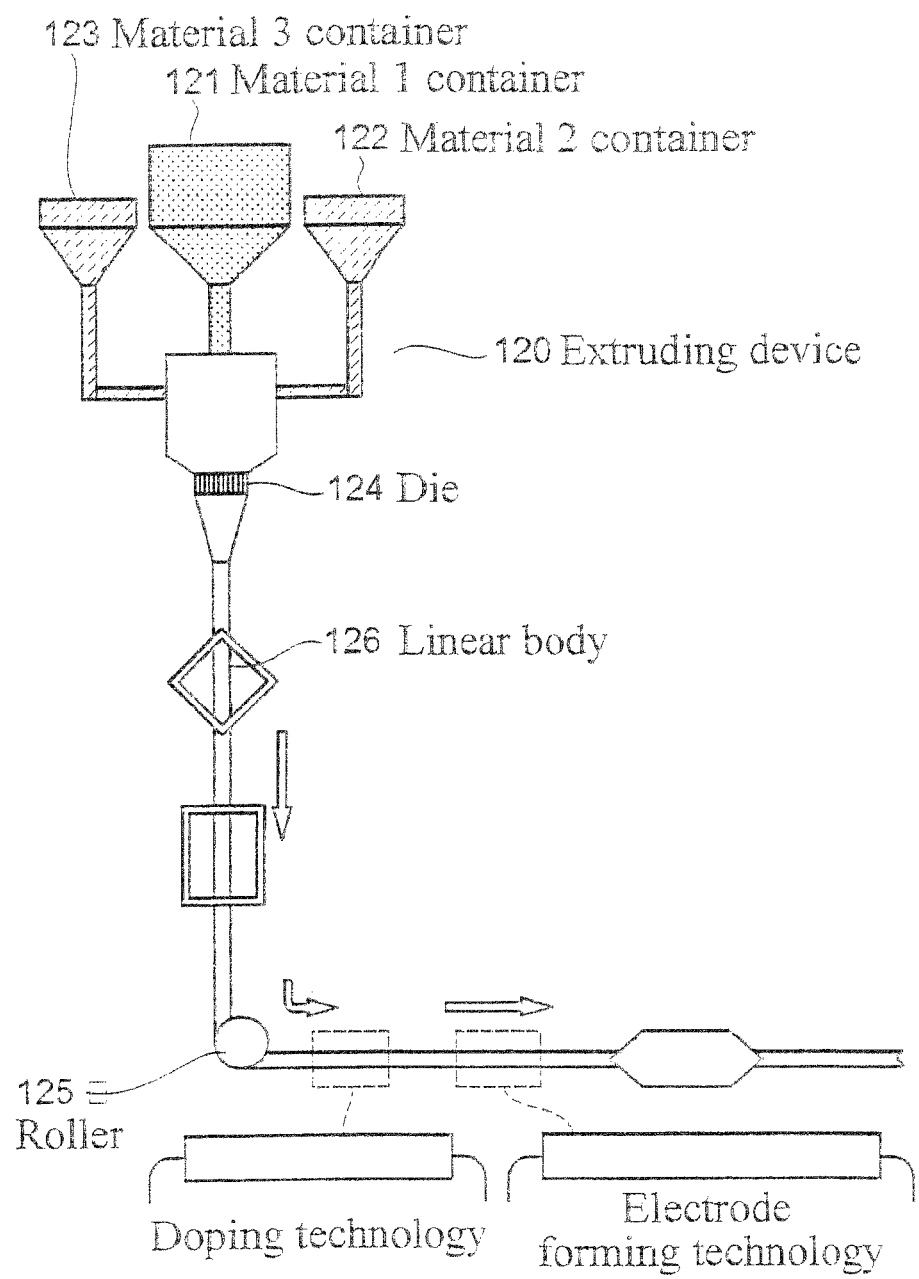
FIG. 11 is a conceptual front view showing an example of a manufacturing device of a linear light-emitting element.

FIG. 11 shows a general construction of an extruding device for forming the linear light-emitting element of the present invention.

An extruding device 120 has material containers 121, 122, 123 for holding a material to constitute the plural regions in the molten state, dissolved state or gel state. In the example shown in FIG. 11, three material containers are shown but the number can be chosen as appropriate according to the constitution of the linear element to be manufactured.

The material within the material container 123 is fed to a die 124. The die 124 has an injection nozzle formed according to the section of the linear light-emitting element to be manufactured. The linear body injected through the injection hole is wound by a roller 125 or fed to the next process in the linear state as necessary.

When the linear element in the structure shown in FIG. 1 is to be manufactured, the constitution shown in FIG. 11 is employed.

Within the material containers 121, 122, 123, a source, a drain material, a semiconductor material and a gate material are held respectively in the molten, dissolved of gel state. In the meantime, the die 124 has holes formed communicating to each of the material containers.

Figure 12:
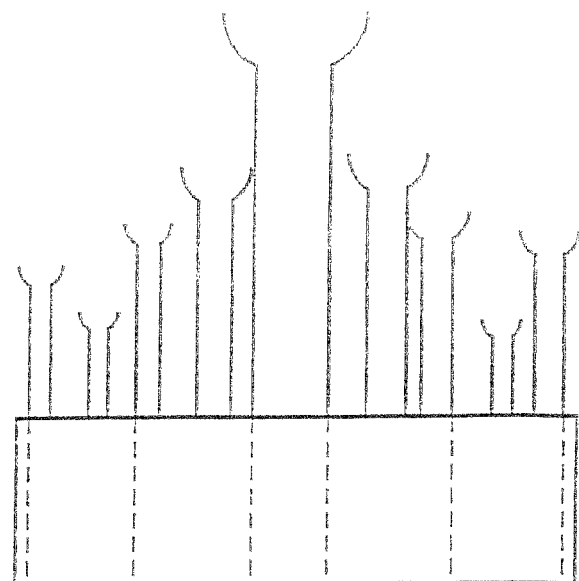
FIG. 12 is a front view showing an extruding device used in manufacture of a linear light-emitting element and a plan view of a die.
Figure 12:
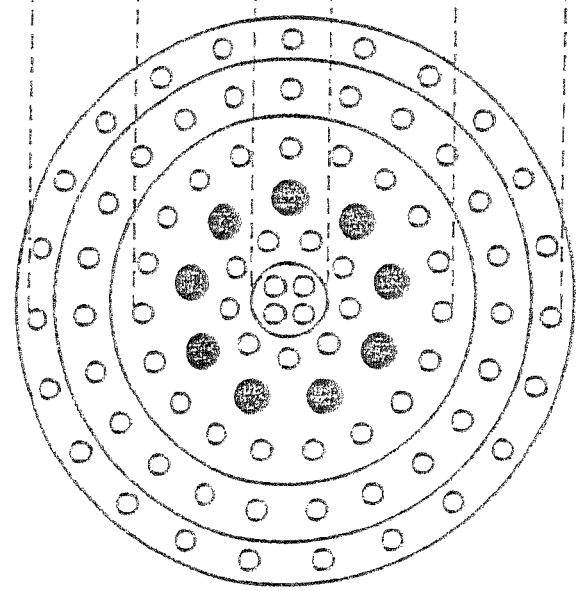

As shown in FIG. 12, a plurality of holes are formed for injecting the source material at the center. Around the periphery, a plurality of holes for injecting the semiconductor material and the gate material are formed. And on the periphery, a plurality of holes for injecting the drain material are further formed.

When the materials in the molten, dissolved or gel state are sent from each of the material containers to the die 124 and the materials are injected from the die, the materials are injected through each of the holes and solidified. The linear light-emitting element in the continuous linear state is formed by pulling its end.

The linear light-emitting element is wound by the roller 125. Or it is sent to the next process in the linear state as necessary.

Figure 13:
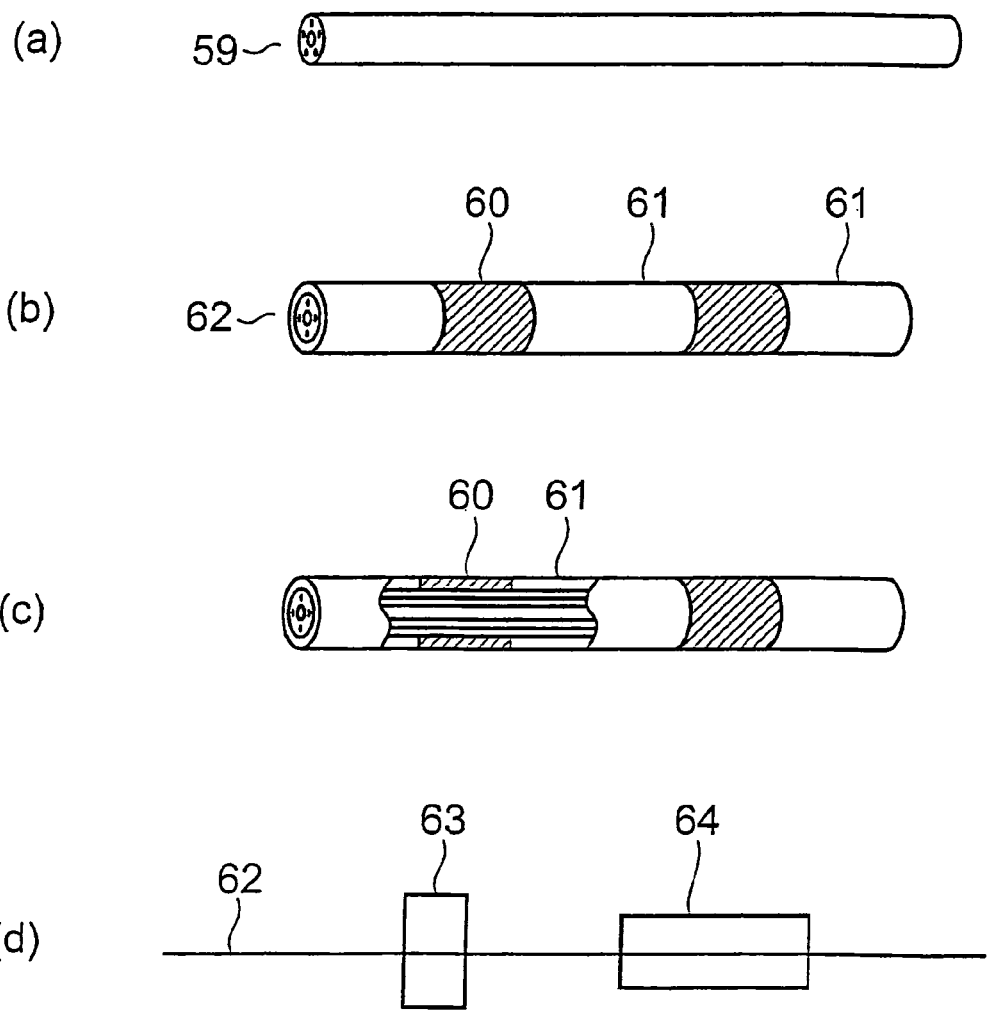
FIGS. 13(a) to (d) are perspective views showing a manufacturing process of a linear light-emitting element according to the present invention.

First, the source region, the semiconductor region and the gate electrodes are extruded to form a linear intermediate body 59 (FIG. 13(a)).

Next, the outside of the semiconductor region is coated by the light-emitting layer material and the semiconductor material for forming the drain region in the molten, dissolved or gel state to have a secondary intermediate body 62 (FIG. 13(b)). This coating can be performed by passing the linear intermediate body in a tank of the semiconductor material in the molten, dissolved or gel state. Or a deposition method can be adopted.

Next, while passing the linear secondary intermediate body 62 through a pressure reducing chamber, ion implantation of oxygen or the like is selectively performed by controlling the injection range to provide a separation region 60 made of an insulator on a part of the surface of the linear body 59 (FIGS. 13(c), (d)).

Then, by passing it through a heat treatment chamber 64 for anneal, impurities in the semiconductor region is activated and the source region and the drain region are formed.

By the above processes, the linear body in which the source region and the gate electrodes continue in the longitudinal direction inside and the drain region is formed intermittently is formed (FIG. 13(c)).

In this way, extrusion and external processing may be combined as appropriate according to arrangement and material of the region to be formed. In this preferred embodiment, explanation was made on the case where only the drain region is formed intermittently, while the source region and the gate electrodes are formed continuously, but not limited to this case, it is obvious that the effect of the linear light-emitting element of the present invention can be also obtained in such cases are possible that the element regions continue in the longitudinal direction or the source region, the gate electrodes and the drain region are all formed intermittently.

Figure 14:
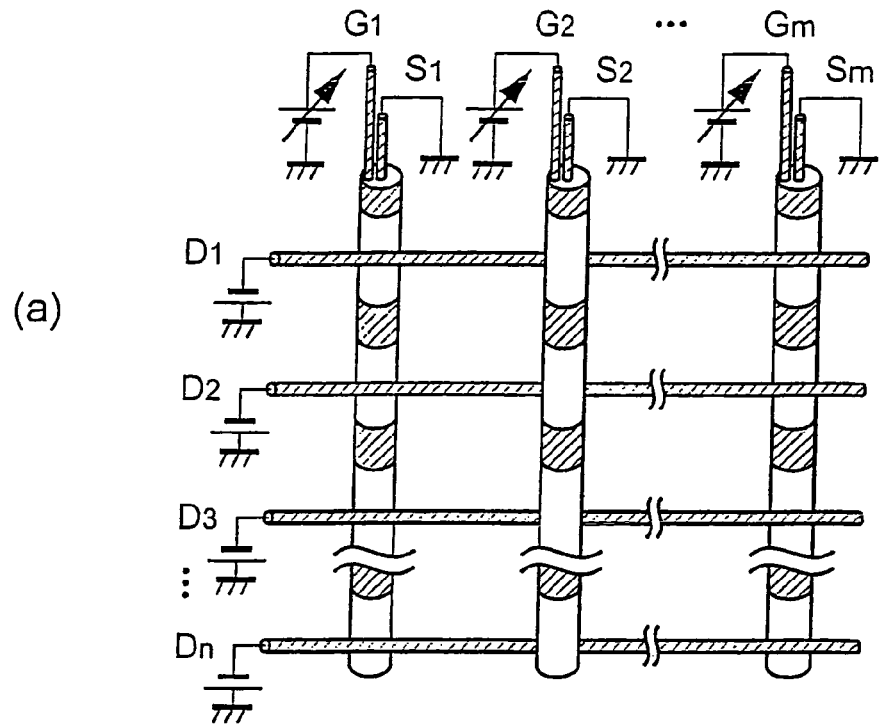
FIGS. 14(a) and (b) are a perspective view and a circuit diagram of a light-emitting device produced with a linear light-emitting element of the present invention.
Figure 14:
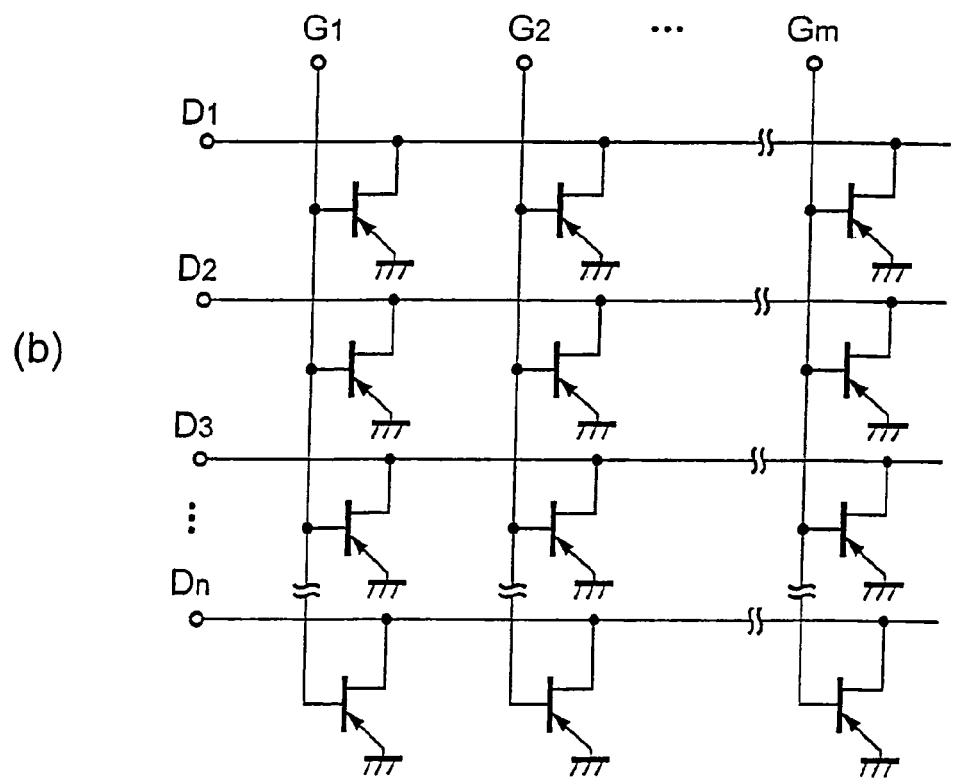

FIGS. 14(a) and (b) are a perspective view and a circuit diagram of a light-emitting device fabricated by the linear light-emitting element of the present invention. In FIG. 14(a), a plurality of linear light-emitting elements intermittently forming a light-emitting device is made into a warp, while a conductive linear body to be drain wiring as weft, a plane-state light-emitting device made of the light-emitting elements arranged in the array state is formed as weaving a cloth. The source region of each warp is connected to grounding potential and gate electrodes are connected to an external gate voltage control device for controlling the light-emitting elements arranged in each row, for example. The drain region to which each weft is connected is connected to an external drain voltage control device. The circuit diagram of the corresponding light-emitting device portion is shown in FIG. 14(b). A bias voltage is applied to the drain connected to D2 wiring at certain timing, while bias voltage of the other drain wiring is off, for example. In this case, only the light-emitting elements arranged on the second line are made controllable by the gate voltage control device. By switching the voltage to be applied to the drain wiring to D1, D2, D3 . . . , the light-emitting intensity of the whole array of the light-emitting elements can be controlled.

A conventional light-emitting device was formed on a continuous flat substrate. Therefore, there were problems that when the device is to be enlarged, manufacture equipment should be also made large and improvement of yield becomes difficult with increase of the size since only one defect in the light-emitting element constituting the device results in the whole device defective. However, in the light-emitting device constituted by the linear light-emitting element of the present invention, a plane-state light-emitting device can be produced by combining the fabricated linear light-emitting elements, and a large-sized display device or illuminating device can be produced not depending on the scale of the manufacture equipment. Also, a plane-state light-emitting device can be made by choosing only non-defective linear light-emitting elements. Or, a defective part can be replaced by a non-defective one after a plane-state light-emitting device is made, and yield can be improved even if the size of the light-emitting device is increased.

Second Preferred Embodiment

Figure 2:
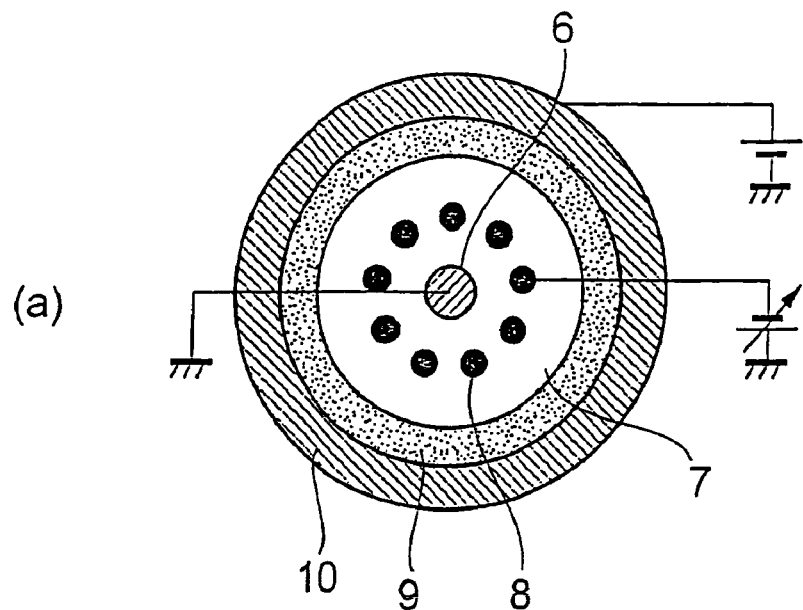
FIGS. 2(a) and (b) are a sectional view and a circuit diagram of a linear light-emitting element according to a second preferred embodiment of the present invention.

FIG. 2(a) is a sectional view of the linear light-emitting element according to a second preferred embodiment of the present invention. This is formed by sequentially laminating a semiconductor region 7, a light-emitting region 9 and a source region 10 around a drain region 6 made of a conductive N-type high molecular material. In the semiconductor region 7, a plurality of gate electrodes 8 made of a P-type high molecular material are arranged surrounding the drain region 6.

FIG. 2(b) is a circuit diagram of a linear light-emitting element according to the second preferred embodiment of the present invention. For example, the drain region 6 is connected to the grounding potential and a positive bias voltage is applied to the source region 10. A negative control voltage is applied to the gate electrode 8. A positive hole is injected from the source region 10, an electron is injected from the drain region 6, and the injected positive hole and electron are re-bonded in the light-emitting region 9, which causes the light-emitting region 9 to emit light. The light-emitting intensity is controlled by controlling the injection amount of the electrons by the negative control voltage applied to the gate electrode 8.

Third Preferred Embodiment

Figure 3:
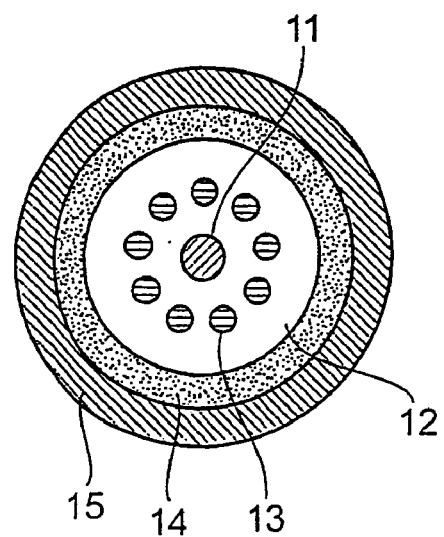
FIG. 3 is a sectional view of a linear light-emitting element according to a third preferred embodiment of the present invention.

FIG. 3 is a sectional view of the linear light-emitting element according to a third preferred embodiment of the present invention. This is formed by sequentially laminating a semiconductor region 12 made of a P-type high molecular material, a light-emitting region 14 and a drain region 15 around a source region 11 made of a conductive high molecular material. In the semiconductor region 12, a plurality of gate electrodes 13 made of a conductive material are arranged surrounding the source region 11.

For example the source region 11 is connected to the grounding potential and a negative bias voltage is applied to the drain region 15. A positive control voltage is applied to the gate electrode 13. A positive hole is injected from the source region 11, an electron is injected from the drain region 15, and the injected positive hole and electron are re-bonded in a light-emitting region 14, which causes the light-emitting region 14 to emit light. The light-emitting intensity is controlled by controlling the injection amount of the positive holes by the positive control voltage applied to the gate electrode 13.

In the third preferred embodiment of the present invention, explanation was made such that the semiconductor region 12 is made of a P-type high molecular material, but even if the semiconductor region 12 is made of an N-type high molecular material, it is obvious that the embodiment operates as a light-emitting element and the effect of the present invention is similarly obtained by appropriately selecting the polarity of voltage to be applied to the source region, the drain region and the gate electrodes.

Fourth Preferred Embodiment

Figure 4:
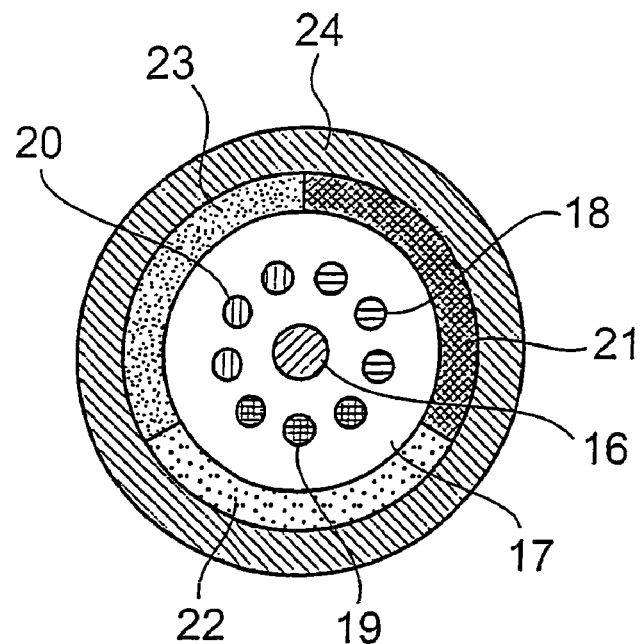
FIG. 4 is a sectional view of a linear light-emitting element according to a fourth preferred embodiment of the present invention.

FIG. 4 is a sectional view of the linear light-emitting element according to a fourth preferred embodiment of the present invention. This is formed by sequentially laminating a semiconductor region 17 made of a P-type high molecular material, light-emitting regions 21, 22, 23 and a drain region 24 around a source region 16 made of a conductive high molecular material. In the light-emitting region, the red light-emitting region 21, green light-emitting region 22 and blue light-emitting region 23 are arranged in three equal parts along the circumference. In the semiconductor region 17, a plurality of first gate electrodes 18, second gate electrodes 19 and third gate electrodes 20 made of an N-type high molecular semiconductor material are arranged at positions corresponding to the red light-emitting region 21, green light-emitting region 22 and blue light-emitting region 23, respectively, surrounding the source region 16

For example, the source region 16 is connected to the grounding potential, and a negative bias voltage is applied to the drain region 24. A positive control voltage is applied to the gate electrodes 21, 22, 23. A positive hole is injected from the source region 16, an electron is injected from the drain region 24, the injected positive hole and electron are re-bonded in the light-emitting regions 21, 22, 23, which causes the light-emitting regions 21, 22, 23 to emit light. The light-emitting intensity of the red, green and blue light-emitting layers is controlled independently by controlling the injection amount of the positive holes by the positive control voltage applied to the corresponding gate electrodes 21, 22, 23.

Therefore, full-color light-emitting control is made possible by a single linear light-emitting element.

Fifth Preferred Embodiment

Figure 5:
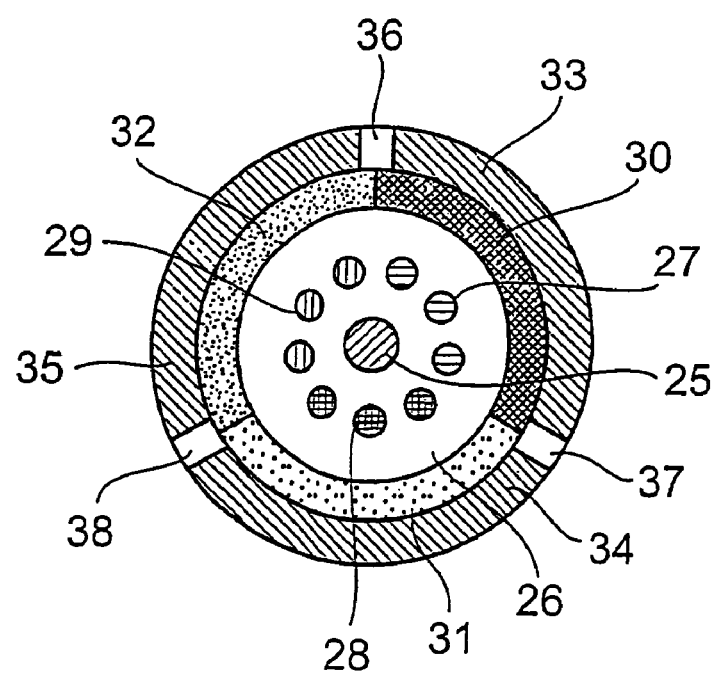
FIG. 5 is a sectional view of a linear light-emitting element according to a fifth preferred embodiment of the present invention.

FIG. 5 is a sectional view of the linear light-emitting element according to a fifth preferred embodiment of the present invention. This is formed by sequentially laminating a semiconductor region 26 made of a P-type high molecular material, light-emitting regions 30, 31, 32 and drain regions 33, 34, 35 around a source region 25 made of a conductive high molecular material. In the light-emitting region, the red light-emitting region 30, green light-emitting region 31 and blue light-emitting region 32 are arranged in three equal parts along the circumference. In the semiconductor region 26, a first gate electrode 27 made of an N-type high molecular semiconductor material, a second gate electrode 28 and a third gate electrode 29 are arranged at positions corresponding to the red light-emitting region 30, green light-emitting region 31 and blue light-emitting region 32, respectively, surrounding the source region 25. Also, the drain regions 33, 34, 35 are also arranged at positions corresponding to the red light-emitting region 30, green light-emitting region 31 and blue light-emitting region 32, respectively, to prevent short circuit between drains, and the drain regions are electrically insulated from each other by insulating regions 36, 37, 38.

For example, the source region 25 is connected to the grounding potential. When a negative bias voltage is applied to the drain region 33 and a positive control voltage to the gate electrode 27, the red light-emitting region 30 emits light. When a negative bias voltage is applied to the drain region 34 and a positive control voltage to the gate electrode 28, the green light-emitting region 31 emits light. When a negative bias voltage is applied to the drain region 35 and a positive control voltage to the gate electrode 29, the blue light-emitting region 32 emits light.

Therefore, full-color light-emitting control is made possible by a single linear light-emitting element. Since the linear light-emitting element according to the fifth preferred embodiment can turn off each of the light-emitting elements by turning off the bias voltage to be applied to the drain region, the structure is more complicated than that of the linear light-emitting element according to the fourth preferred embodiment, but light-emitting control of each light-emitting region is facilitated, and more vivid full-color light emission is made possible.

Sixth Preferred Embodiment

Figure 6:
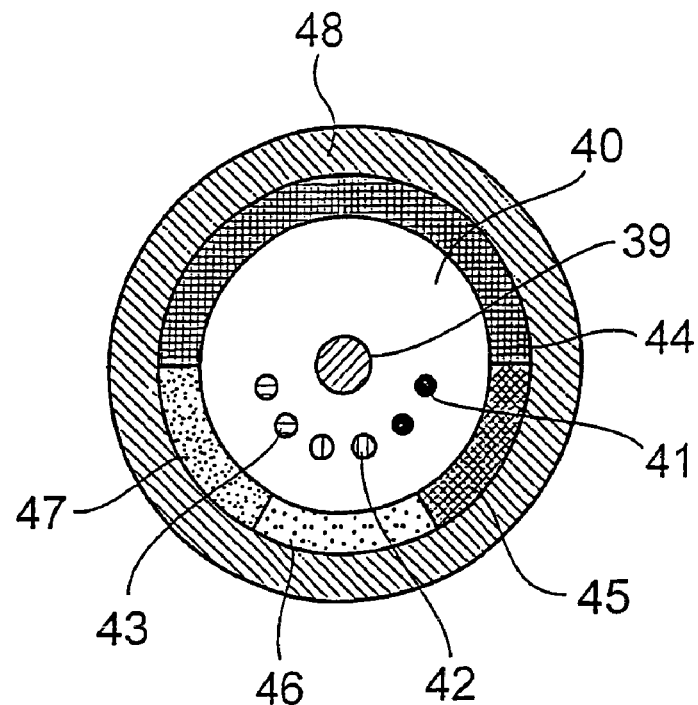
FIG. 6 is a sectional view of a linear light-emitting element according to a sixth preferred embodiment of the present invention.

FIG. 6 is a sectional view of the linear light-emitting element according to a sixth preferred embodiment of the present invention. This is formed by sequentially laminating a semiconductor region 40 made of a P-type high molecular material, light-emitting regions 45, 46, 47, a reflection region 44 and a drain region 48 around a source region 39 made of a conductive high molecular material. In the light-emitting region, the red light-emitting region 45, green light-emitting region 46 and blue light-emitting region 47 are arranged in three equal parts along the half circumference. Along the other half circumference is formed the reflection region made of aluminum or the like. In the semiconductor region 40, a plurality of first gate electrodes 41, second gate electrodes 42 and third gate electrodes 43 made of an N-type high molecular material are arranged at positions corresponding to the red light-emitting region 45, the green light-emitting region 46 and the blue light-emitting region 47, respectively, surrounding the source region 39.

For example, the source region 39 is connected to the grounding potential, and a negative bias voltage is applied to the drain region 48. A positive control voltage is applied to the gate electrodes 41, 42, 43. A positive hole is injected from the source region 39, an electron is injected from the drain region 48, and the injected positive hole and electron are re-bonded in the light-emitting regions 45, 46, 47, which causes the light-emitting regions 45, 46, 47 to emit light. The light-emitting intensity of the red, green and blue light-emitting layers is controlled independently by controlling the injection amount of the positive holes by the positive control voltage applied to the corresponding gate electrodes 41, 42, 43.

Therefore, full-color light-emitting control is made possible by a single linear light-emitting element. Also, by arranging the linear light-emitting element so that the portion provided with the light-emitting layers comes to the front when the linear light-emitting element is seen from the side, light of each of the red, green and blue light-emitting layers can be seen with a good balance. Since the reflection region is arranged on the back side of the light-emitting layers, the light emitted from the linear light-emitting element can be utilized efficiently.

Seventh Preferred Embodiment

Figure 7:
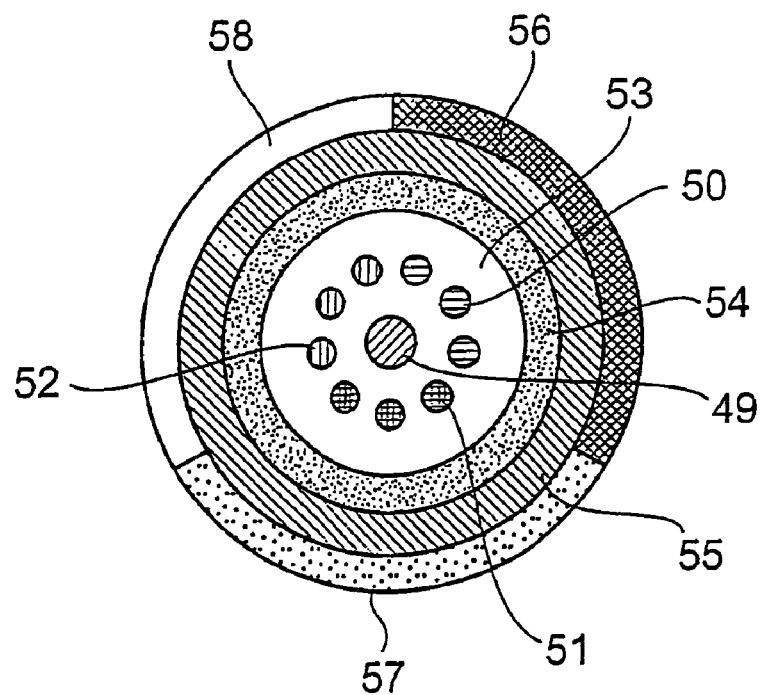
FIG. 7 is a sectional view of a linear light-emitting element according to a seventh preferred embodiment of the present invention.

FIG. 7 is a sectional view of the linear light-emitting element according to a seventh preferred embodiment of the present invention. This is formed by sequentially laminating a semiconductor region 53 made of a P-type high molecular material, a white light-emitting region 54 and a drain region 55 around a source region 49 made of a conductive high molecular material. Moreover, around the drain region 55, a red transmission filter 56, a green transmission filter 57 and a blue transmission filter 58 are arranged in three equal parts along the circumference. In the semiconductor region 53, a plurality of first gate electrodes 50, second gate electrodes 51 and third gate electrodes 52 made of an N-type high molecular semiconductor material are arranged, respectively, at positions corresponding to the red transmission filter 56, green transmission filter 57 and blue transmission filter 58 surrounding the source region 49.

For example, the source region 49 is connected to the grounding potential, and a negative bias voltage is applied to the drain region 54. A positive control voltage is applied to the gate electrodes 50, 51, 52. The light-emitting intensity of the red, green and blue light-emitting layers is controlled independently by controlling the injection amount of the positive holes by a positive control voltage applied to the corresponding gate electrodes 50, 51, 52.

Therefore, full-color light-emitting control can be made possible with a single linear light-emitting element.

Eighth Preferred Embodiment

FIG. 8(a) is a sectional view of the linear light-emitting element according to a eighth preferred embodiment of the present invention. In FIG. 8(a), a gate insulating film 66 is arranged around a linear gate electrode 65, around which an anode 67 having an opening portion and a light-emitting region 68 are sequentially laminated. Around the light-emitting region 68, at the position corresponding to the opening of the anode 67, a cathode 69 is arranged. The light-emitting control region made of the gate electrode 65, the gate insulating film 66, the anode 67 and the cathode 69 surrounds the light-emitting region 68 in the section of the linear body so as to control the light-emitting intensity of the light-emitting region 68.

Figure 8:
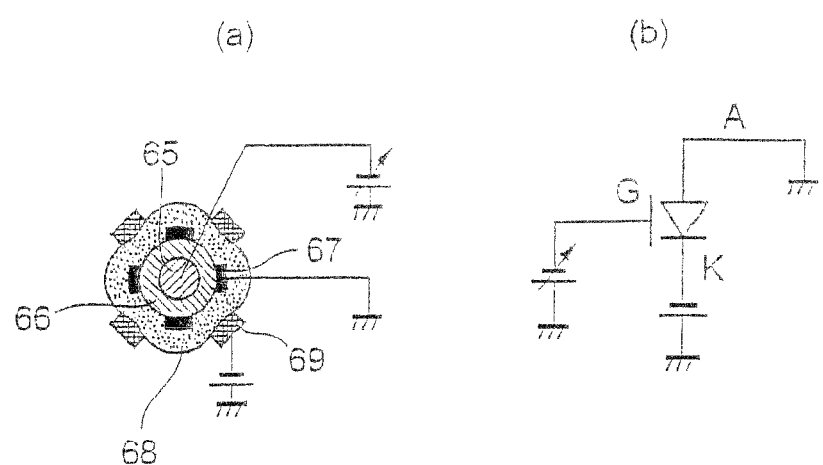
FIGS. 8(a) and (b) are a sectional view and a circuit diagram, respectively, of a linear light-emitting element of an eighth preferred embodiment of the present invention.
Figure 9:
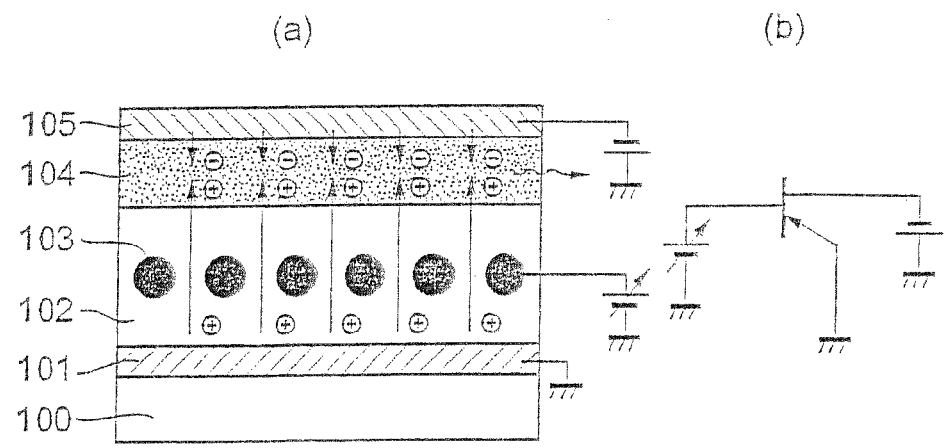
FIGS. 9(a) and (b) are a sectional view and a circuit diagram, respectively, of a conventional light-emitting element.
Figure 10:
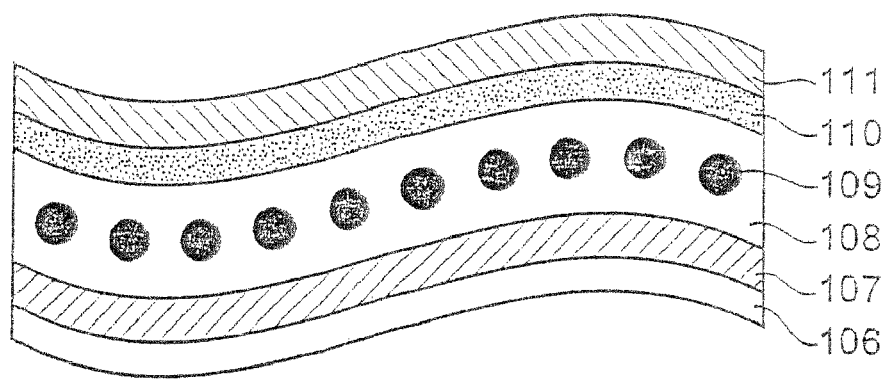
FIG. 10 is a sectional view of a conventional light-emitting element.

It is obvious that the linear element of the present invention shown in FIG. 8 functions as a light-emitting element and the effect of the present invention can be also obtained by the case that the gate electrode 65 has a hollow region at the center or an insulator region, semiconductor region or conductor region made of a material different from the material constituting the source region.

FIG. 8(b) is a circuit diagram of the linear light-emitting element according to the eighth preferred embodiment of the present invention. The anode 67 is connected to the grounding potential, a negative bias voltage is applied to the cathode 69 and a negative control voltage is applied to the gate electrode 65. The light-emitting region 68 may be made as a multilayer film, instead of a single-layer film made of the light-emitting layer, by combining the light-emitting layer with a positive-hole injection layer, a positive-hole transport layer, an electron transport layer or an electron injection layer. The positive holes injected from the anode 67 and the electrons injected from the cathode 69 are re-bonded in the light-emitting layer, which causes the light-emitting layer to emit light. When a negative control voltage is applied to the gate electrode 65, the positive hole injected from the anode 67 are captured by the gate insulating film 66 and the number of re-bonded positive holes is decreased. Therefore, the light-emitting intensity can be controlled by the control voltage applied to the gate electrode 65.

Ninth Preferred Embodiment

Figure 15:
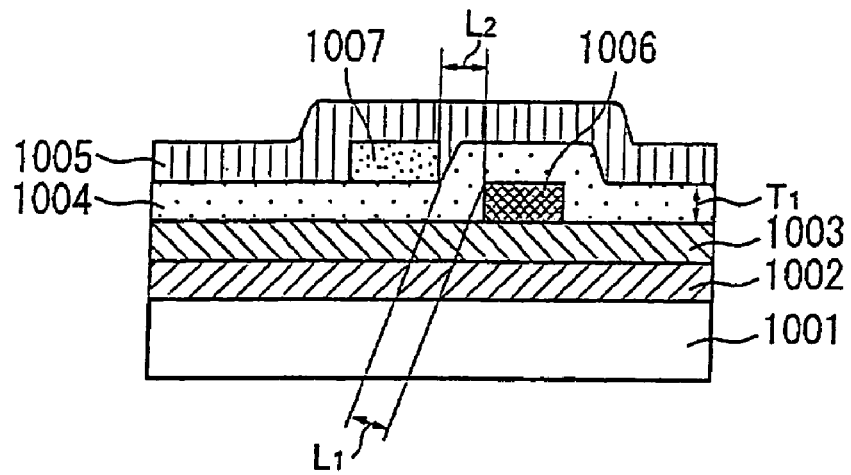
FIG. 15 is a sectional view of a light-emitting element according to a ninth preferred embodiment of the present invention.

FIG. 15 is a sectional view of the light-emitting element according to a ninth preferred embodiment of the present invention. This is formed by sequentially laminating a gate electrode 1002, a gate insulating film 1003 on a glass substrate 1001. An anode 1006 is formed on the gate insulating film 1003, and a light-emitting layer 1004 is formed covering the anode 1006 over the gate insulating film 1003. A cathode 1007 is arranged over the light-emitting layer 1006 as if holding the light-emitting layer 1004 between the anode 1006 and the cathode 1007. Also, a protective insulating film 1005 is formed covering the light-emitting layer 1004 and the cathode 1007. A distance L1 between the cathode 1007 and the anode 1006 is determined by a film thickness T1 of the light-emitting layer 1004. With a forming technology of organic thin-film transistor in which photolithography technology can not be used for the fear of alteration of the thin-film material, the channel length can be made not more than 0.5 μm using a technology at a normal temperature or a normal pressure such as normal printing or deposition technology, for example.

Next, the operation principle of the light-emitting element of the present invention will be described using FIGS. 22(a), (b).

Figure 22:
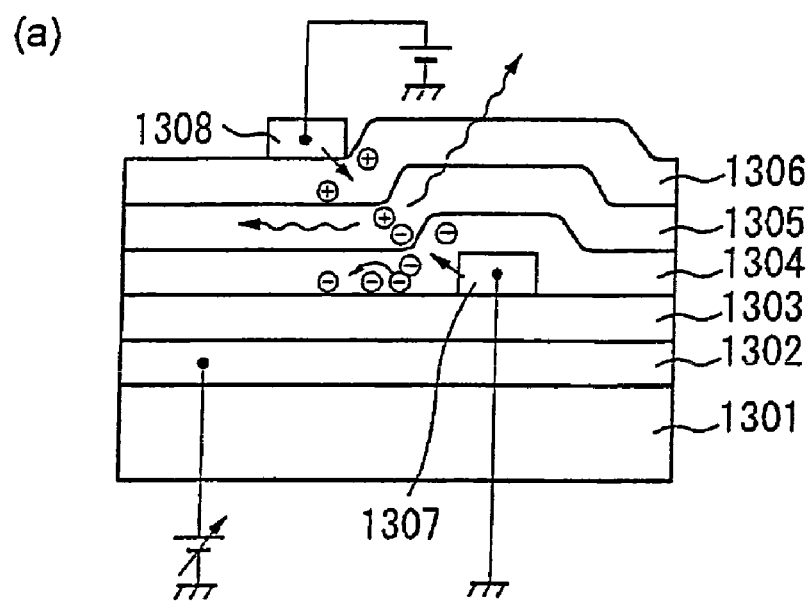
FIGS. 22(a) and (b) are sectional views for explaining operation principle of a light-emitting element of the present invention.
Figure 22:
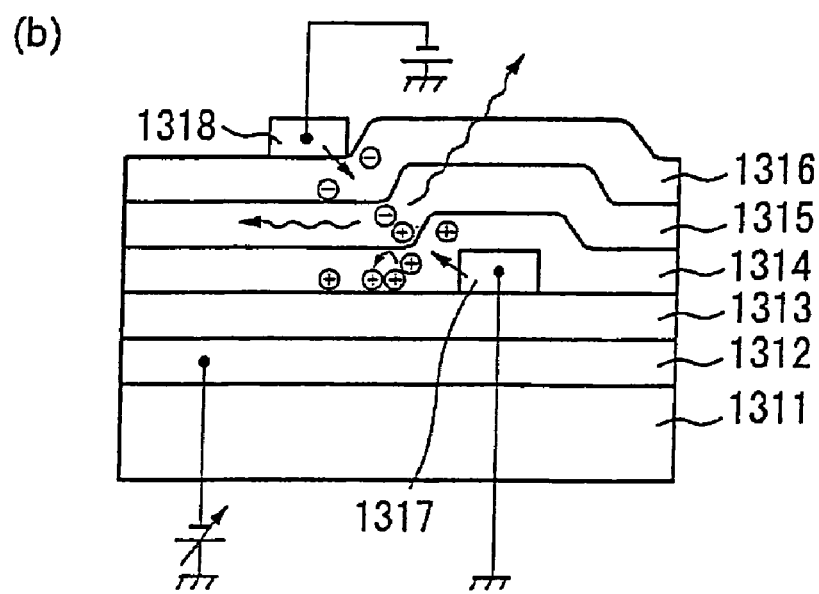

FIG. 22(a) is a sectional view of the light-emitting element of the case where the light-emitting film is a 3-layer film with the electron transport layer, the light-emitting layer and the positive hole transport layer are lamented in this order from below. The light-emitting element is constituted by forming a gate electrode 1302, a gate insulating film 1303, a cathode 1307, an electron transport layer 1304, a light-emitting layer 1305, a positive-hole transport layer 1306 and an anode 1308 on a glass substrate 1301. For example, the cathode 1307 is made as grounding potential, a positive bias voltage is applied to the anode 1308, and a positive control voltage is applied to the gate electrode 1302. An electron is injected to the electron transport layer 1304 from the cathode 1307, a positive hole is injected to the positive hole injection layer 1306 from the anode 1308, the injected electrons and positive holes are re-bonded in the light-emitting layer 1305, which causes the light-emitting layer 1305 to emit light. A part of the electrons injected from the cathode is captured on the gate insulating film 1303 side by the positive bias voltage applied to the gate electrode, and by increasing the control voltage applied to the gate electrode 1302, the number of electrons injected to the light-emitting layer 1305 is decreased, the light-emitting intensity is lowered and the control of the light-emitting intensity is made possible.

FIG. 22(b) is a sectional view of the light-emitting element of the case where the light-emitting film is a 3-layer film of the positive-hole transport layer, the light-emitting layer and the electron transport layer laminated in this order from below. The light-emitting element is constituted by forming a gate electrode 1312, a gate insulating film 1313, an anode 1317, a positive-hole transport layer 1314, a light-emitting layer 1315, an electron transport layer 1316 and a cathode 1318 on a glass substrate 1311. For example, the anode 1317 is made as grounding potential, a negative bias voltage is applied to a cathode 1318, and a negative control voltage is applied to the gate electrode 1312. A positive hole is infected to the positive-hole transport layer 1314 from the anode 1317, an electron is injected to the electron injection layer 1316 from the cathode 1318, and the injected electrons and the positive holes are re-bonded in the light-emitting layer 1315, which causes the light-emitting layer 1315 to emit light. Since a part of the positive holes injected from the anode is captured by the gate insulating film 1313 side by the negative bias voltage applied to the gate electrode, by increasing the control voltage applied to the gate electrode 1312, the number of positive holes injected to the light-emitting layer 1315 is decreased, the light-emitting intensity is lowered and the control of the light-emitting intensity is made possible.

In FIG. 15, as appropriate relative positional relations between the cathode 1007 and the anode 1006, the interval between them is preferably −5 µm to 10 µm. The case where the interval is negative means that there is an overlapping portion between the cathode and the anode, but if the interval is less than −5 µm, that is, the overlapping portion is too large, controllability of the positive-hole current by the control voltage applied to the gate electrode is made poor, the cathode and the anode are separated from each other too much on the contrary, while if the interval is larger than 10 µm, the pixel size of the light-emitting element is increased, and when it is used for a display device, for example, resolution is worsened. Also, the interval between the cathode and the anode is increased and driving by a low voltage becomes difficult. Moreover, as the appropriate relative positional relations between the cathode 7 and the anode 6, the interval between them is preferably 0.5 µm to 3 µm. If the interval of the vertical line is 0.5 µm to 3 µm, controllability of the light-emitting intensity is high, the pixel size is small and driving by a low voltage becomes easy.

Tenth Preferred Embodiment

Figure 16:
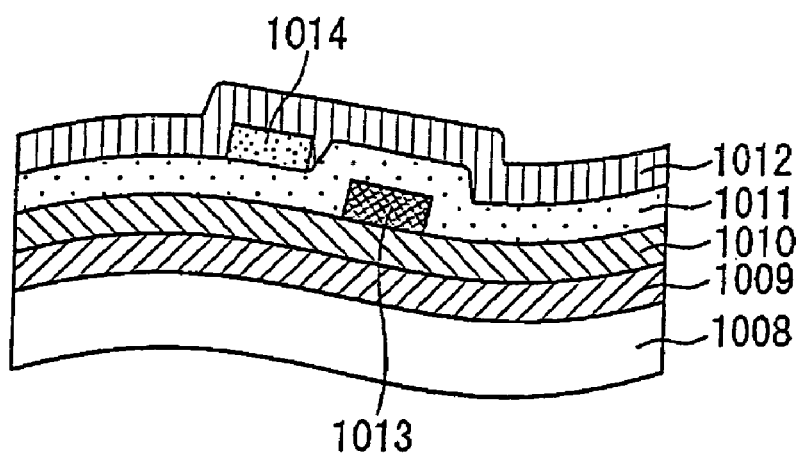
FIG. 16 is a sectional view of a light-emitting element according to a tenth preferred embodiment of the present invention.

FIG. 16 is a sectional view of the light-emitting element according to a tenth preferred embodiment of the present invention and this is different from the preferred embodiment of the present invention shown in FIG. 15 in the point that the light-emitting element is formed on a plastic substrate. The light-emitting element according to the tenth preferred embodiment of the present invention is formed by sequentially laminating a gate electrode 1009 and a gate insulating film 1010 on a plastic substrate 1008. An anode 1013 is formed on the gate insulating film 1010, a light-emitting layer 1011 is formed covering the anode 1013 over the gate insulating film 1010 and a cathode 1014 is arranged over the light-emitting layer 1011 as if holding the light-emitting layer 1011 between the anode 1013 and the cathode 1014. Moreover, a protective insulating film 1012 is formed covering the light-emitting layer 1011 and the cathode 1014. Since the light-emitting element is formed on the plastic substrate, the light-emitting element is flexible and light-weighted and can be used for a wide range of applications such as a mobile phone.

Eleventh Preferred Embodiment

Figure 17:
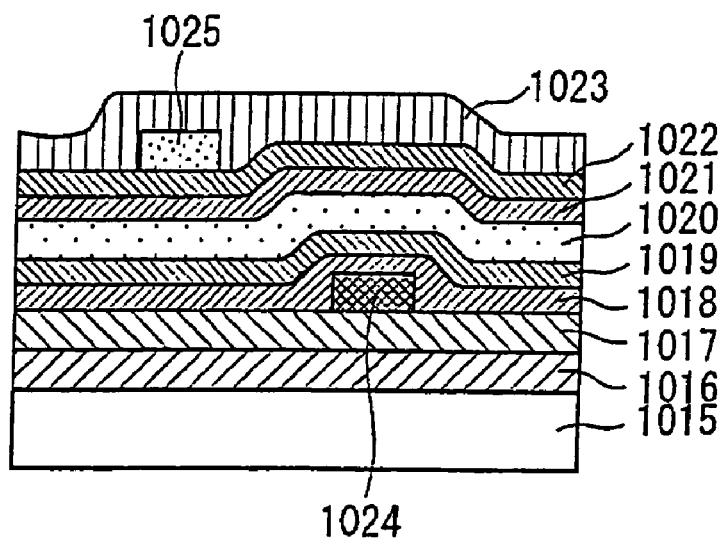
FIG. 17 is a sectional view of a light-emitting element according to an eleventh preferred embodiment of the present invention.

FIG. 17 is a sectional view of the light-emitting element according to an eleventh preferred embodiment of the present invention and a 5-layer film consisting of a positive-hole injection layer, a positive-hole transport layer, a light-emitting layer, an electron transport layer and an electron injection layer is used as a light-emitting film. This is formed on a glass substrate 1015 by sequentially laminating a gate electrode 1016 and a gate insulating film 1017. As a material for the gate electrode, a transparent electrode such as ITO (Indium Tin Oxide), for example, is used. As a material for the gate insulating film, an insulating inorganic material made of $SiO_2$, $TaO_2$, for example, or an insulating organic material is used. On the gate insulating film 1017, an anode 1024, a positive-hole injection layer 1018, a positive-hole transport layer 1019, a light-emitting layer 1020, an electron transport layer 1021, an electron injection layer 1022, a cathode 1025 and a protective insulating film 1023 are formed. As a material for the anode 1024 and the cathode 1025, a conductive organic material such as polyacetylene, polyacene, oligoacene, polythiazyl, polythiophene, poly (3-alkilthiophene), oligothiophene, polypyrrole, polyaniline, polyphenylene, etc. or a conductive inorganic material such as aluminum is used. For the positive-hole injection layer 1018, polythiophene such as copper phthalocyanine and PEDOT or an organic material such as polyaniline is used. For the positive-hole transport layer 1019, an organic material such as TPD and TPAC is used. For the light-emitting layer 1020, a low-molecular organic EL material such as $Alq_3$, NPB or a high-molecular organic EL material such as PPV, poly (3-alkilthiophene) is used. For the electron transport layer 1021, an organic material such as BND, PBD, p-EtTAZ and BCP is used. For the electron injection layer 1022, an inorganic material such as LiF and Mg or an organic material such BND, PBD, p-EtTAZ and BCP is used.

In the preferred embodiment shown in FIG. 17, the 5-layer film made of the positive-hole injection layer, positive-hole transport layer, light-emitting layer, electron transport layer and electron injection layer is used for the light-emitting film, but not limited to the 5-layer film, it is obvious that a 2-layer film in which the light-emitting layer and the electron transport layer are laminated, a 3-layer film in which the positive-hole transport layer, light-emitting layer and electron transport layer are laminated or a 4-layer film in which the positive-hole injection layer, positive-hole transport layer, light-emitting layer and electron injection layer are laminated can be used to form the light-emitting element of the present invention and the same effect as use of the 5-layer film can be obtained. As explained referring to FIGS. 22(a), (b), even if the vertical relations of the anode, positive-hole injection layer, positive-hole transport layer and the electron transport layer, electron injection layer, cathode are changed, by changing the polarity of the bias voltage and the control voltage applied to the light-emitting element, the resulting element functions as the light-emitting element and the effect of the present invention can be similarly obtained. Also, in the preferred embodiment, the protective insulating film 1023 is arranged on the light-emitting layer and the cathode, but a color filter can be also used instead of the protective insulating film. In this case, by using a white light-emitting material in the light-emitting layer, for example, and by using red, green and blue transmission filters, light emission in red, green and blue, respectively can be performed.

Twelfth Preferred Embodiment

Figure 18:
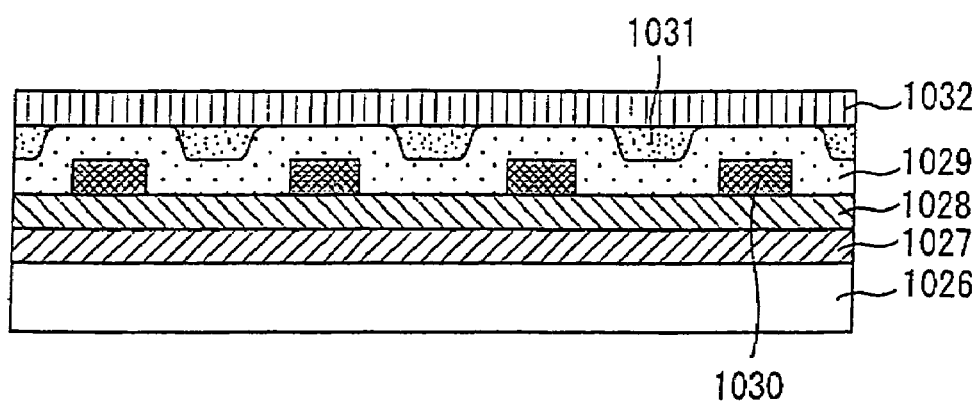
FIG. 18 is a sectional view of a light-emitting element according to a twelfth preferred embodiment of the present invention.

FIG. 18 is a sectional view of the light-emitting element according to a twelfth preferred embodiment of the present invention, in which the light-emitting element is constituted by arranging a plurality of anodes and a plurality of cathodes laterally while holding the light-emitting film between them. By arranging a plurality of anodes and cathodes, control of the light-emitting element with a wider area can be made possible.

Figure 19:
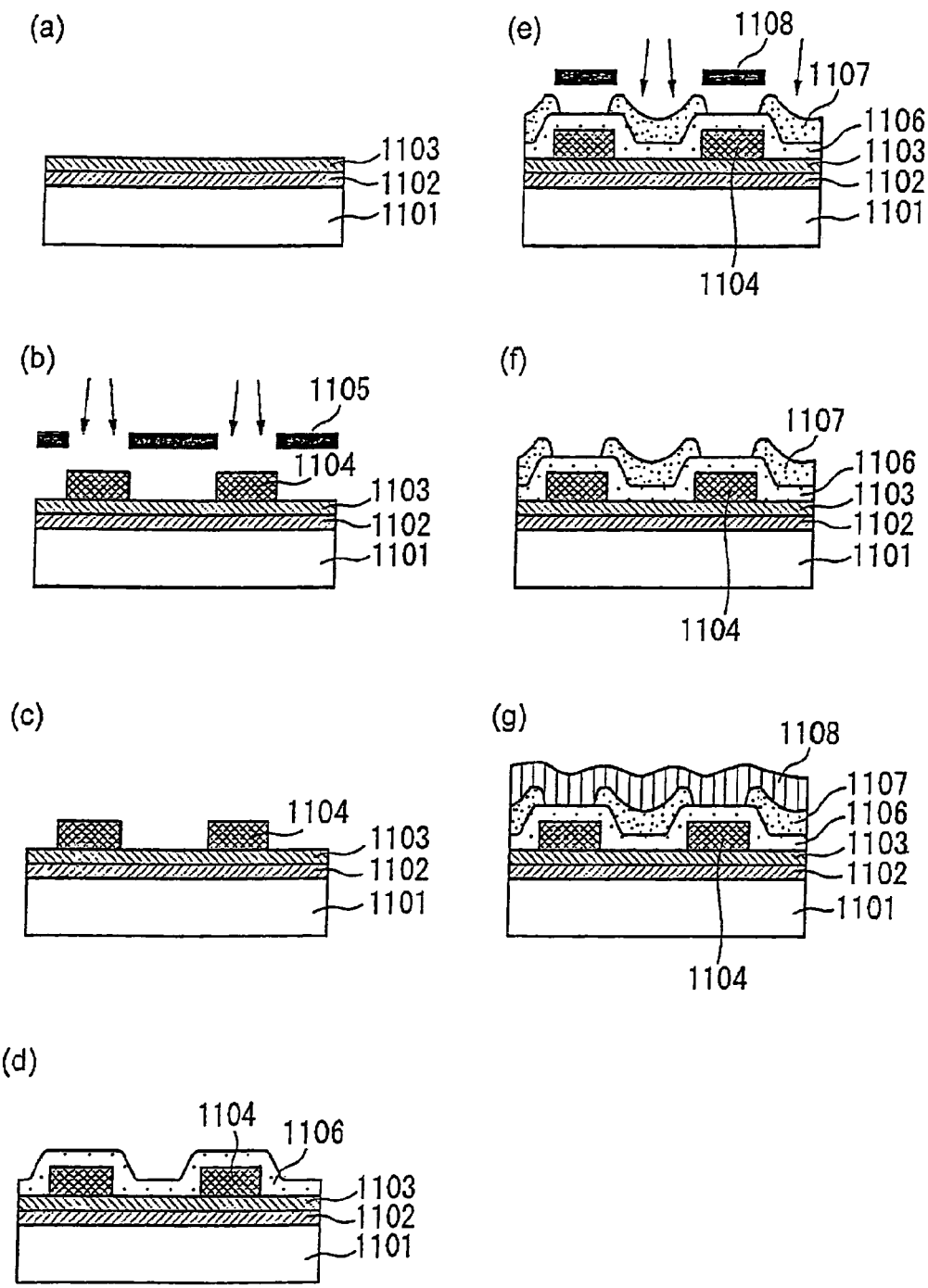
FIGS. 19(a) to (g) are sectional views for explaining a manufacturing process of a light-emitting element according to the twelfth preferred embodiment of the present invention.
Figure 20:
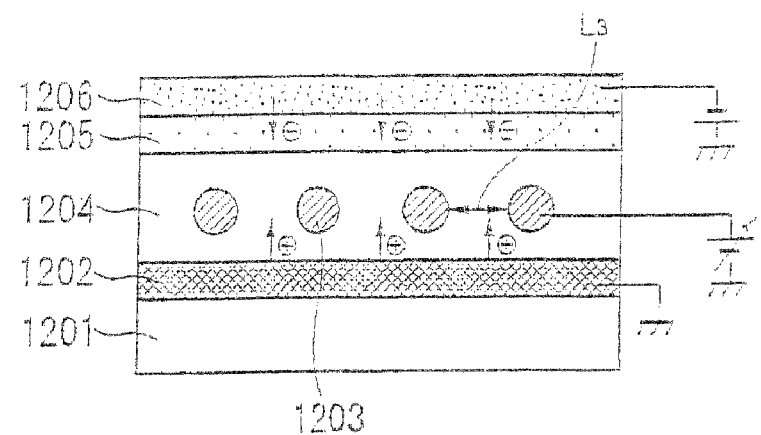
FIG. 20 is a sectional view of a conventional light-emitting element.
Figure 21:
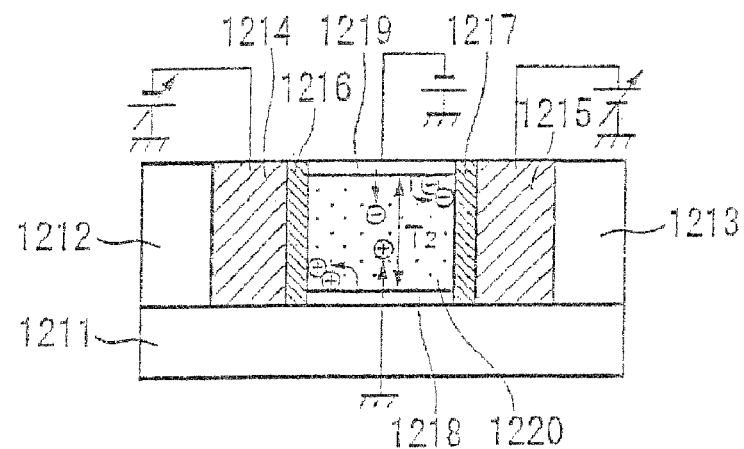
FIG. 21 is a sectional view of a conventional light-emitting element.

FIGS. 19(a) to (g) show sectional view for explaining manufacturing processes of the light-emitting element according to the twelfth preferred embodiment of the present invention, respectively. FIG. 19(a) is a sectional view of the light-emitting element in which a gate electrode 1102 and a gate insulating film 1103 are laminated on a glass substrate 1101. Next, an anode 1104 is formed by depositing a conductive material through a mask 1105 (FIGS. 19(b), (c)). The anode 1104 may be formed not by the deposition method but by other methods such as printing. Next, by a rotating application method or the like, a light-emitting film 1106 is formed on the gate insulating film 1103 and the anode 1104. (FIG. 19(d)). Next, a cathode 1107 is formed by depositing a conductive material through a mask 1108 (FIGS. 19(e), (f)). The cathode 1107 may be also formed not by the deposition method but by other methods such as printing. Next, a protective insulating film 108 is formed on the light-emitting layer 1103 and the cathode 1107 by the rotating application method or the like to complete a light-emitting element.

INDUSTRIAL APPLICABILITY

1. Since the light-emitting region and the light-emitting control region can be incorporated in a single linear body, there are such effects that external driving circuit is not required any more, and driving with a lower voltage becomes possible.
2. Since the plane-state light-emitting device fabricated by weaving or knitting the linear light-emitting element is flexible and light, it can be used in a wide variety of applications including thin-type TV sets, screen of personal computers, display on a mobile phone, electronic paper, etc. It has a characteristic that no shade is generated even if it is used as lighting of a wall portion of the complicated shape.
3. Since a plane-state light-emitting device can be fabricated by combining linear light-emitting elements, a large-sized display or illuminating device not relying on the scale of manufacturing equipment can be produced. Illumination for a dome-type building or display can be produced.
4. A plane-state display device or illuminating device can be produced by inspecting linear light-emitting elements and using only selected non-defective products. Or, since inspection can be conducted and defective linear light-emitting elements can be replaced after a plane-state light-emitting device has been produced, yield of the light-emitting device can be improved even without strict process control when the size of the light-emitting device is increased. This effect is particularly advantageous in the case of a light-emitting device of the active matrix type provided with a light-emitting control region in each light-emitting region.
5. Full-color display can be realized with a single linear light-emitting element by arranging light-emitting layers in red, green and blue or light transmitting filters in red, green and blue in a single linear light-emitting element and by independently controlling the control elements corresponding to the respective light-emitting layers or filters. Therefore, color display with high resolution is made possible.
6. By using alkali-metal including fullerene or an organic material doped with alkali-metal including fullerene as an electron injection layer or electron transport layer of a linear light-emitting element, process control of a process for manufacturing light-emitting elements is facilitated. Also, since a sealing structure in the simplified form can be used to seal the light-emitting element or light-emitting device, it is particularly advantageous in manufacture of a linear light-emitting element. Also, there is an effect that the life of the light-emitting element can be prolonged.
7. A light-emitting element having an organic EL film as a light-emitting film and an element for driving can be made in a simple process at a normal temperature and a normal pressure such as printing or deposition technique.
8. The channel length of an organic thin-film transistor can be made not more than 0.5 µm without using fine processing technology, and improvement of light-emitting efficiency and driving with a low voltage can be made possible.
9. A light-emitting device in the active matrix method with low power consumption and a longer life of light-emitting element can be produced in a process with reduced costs.

The invention claimed is:

1. A linear light-emitting element, comprising:
a first region, a semiconductor region, a light-emitting region and a second region arranged from nearly a center to a fringe of a cross section approximately vertical to an axis of the linear light-emitting element,
wherein in the semiconductor region, a plurality of gate electrodes are arranged in a shape of an island and a nearly concentric circle.

2. The linear light-emitting element of claim 1, wherein the first region is a source region and the second region is a drain region, or the first region is a drain region and the second region is a source region.

3. The linear light-emitting element of claim 2, wherein the linear light-emitting element is comprised from a plurality of element regions in which predetermined lengths of the same cross section are formed in a longitudinal direction.

4. A linear light-emitting element, comprising:
a first region, a semiconductor region, a light-emitting region and a second region arranged from nearly a center to a fringe of a cross section approximately vertical to an axis of the linear light-emitting element,
wherein in the semiconductor region, a plurality of gate electrodes are arranged in a shape of an island and a nearly concentric circle, and the center region is comprised from a hollow region, an insulator region, a semiconductor region or a conductive region.

5. The linear light-emitting element of claim 4, wherein the first region is a source region and the second region is a drain region, or the first region is a drain region and the second region is a source region.

6. The linear light-emitting element of claim 5, wherein the linear light-emitting element is comprised from a plurality of element regions in which predetermined lengths of the same cross section are formed in a longitudinal direction.

7. A linear light-emitting element, comprising:
a first region, a semiconductor region, a plurality of light-emitting regions and a second region arranged from nearly a center to a fringe of a cross section approximately vertical to an axis of the linear light-emitting element, wherein in the semiconductor region, a plurality of gate electrodes are arranged in a shape of an island and a nearly concentric circle, and a light-emitting intensity of each light-emitting region is controlled by a voltage supplied to the each gate electrode which is arranged between the nearly center and the corresponding light-emitting region.

8. The linear light-emitting element of claim 7, wherein the first region is a source region and the second region is a drain region, or the first region is a drain region and the second region is a source region.

9. The linear light-emitting element of claim 7, wherein an element region in which the same cross sections are formed in the longitudinal direction is formed continuously or intermittently.

10. The linear light-emitting element of claim 8, wherein the plurality of light-emitting regions are comprised from a red light-emitting region, a green light-emitting region and blue light-emitting region.

11. The linear light-emitting element of claim 9, wherein the plurality of light-emitting regions are comprised from a red light-emitting region, a green light-emitting region and blue light-emitting region.

12. A linear light-emitting element, comprising:
a first region, a semiconductor region, a light-emitting region and a second region are arranged from nearly a center to a fringe of a cross section approximately vertical to an axis of the linear light-emitting element,
wherein in the semiconductor region, a plurality of gate electrodes are arranged in a shape of island and a nearly concentric circle,
a plurality of color filters are arranged at a circumference of the second region, and
a light intensity of each color filter is controlled by a voltage supplied to each gate electrode which is arranged between the nearly center and a corresponding color region.

* * * * *